United States Patent [19]

Law et al.

[11] 3,736,651

[45] June 5, 1973

[54] AUTOMATIC PIN INSERTION AND BONDING TO A METALLIZED PAD ON A SUBSTRATE SURFACE

[75] Inventors: John M. Law, Lighthouse Point; Alfred A. Strickler; Walter Von Kaenel, both of Pompano Beach, all of Fla.

[73] Assignee: International Business Machines Corporation, Armonk, N.Y.

[22] Filed: Aug. 31, 1971

[21] Appl. No.: 176,575

[52] U.S. Cl...........29/428, 29/203 MM, 29/DIG. 44, 214/1 C

[51] Int. Cl..........................................B23p 19/00

[58] Field of Search................29/428, 604, 203 MM, 29/DIG. 44; 198/33 AA; 214/1 C; 133/8 C

[56] References Cited

UNITED STATES PATENTS

| | | | |
|---|---|---|---|
| 2,355,643 | 8/1944 | Grover | 214/1 C |
| 2,985,948 | 5/1961 | Peters | 29/604 |
| 3,129,494 | 4/1964 | Perkins | 29/203 MM |
| 3,319,316 | 5/1967 | Geyer | 29/428 |
| 3,472,356 | 10/1969 | Reppert | 198/33 AA |
| 3,061,919 | 11/1962 | Tack | 29/428 |
| 3,561,088 | 2/1971 | Raickle | 29/203 MM |

*Primary Examiner*—Richard J. Herbst

*Attorney*—M. H. Klitzman, J. Jancin, Jr. and Earl C. Hancock

[57] ABSTRACT

The invention is a method of automatically bonding elongated articles such as headed pins to metallized contact pads on a ceramic substrate. The elongate articles are automatically inserted into the carrier by (1) placing the carrier in a carrier support, (2) releasing elongate articles onto the carrier, (3) vibrating the support to vibrate the carrier and agitate the elongated articles, (4) applying a pressure differential between the tops and the bottoms of the holes to create air flow into the tops of the holes to suck the elongate articles into the holes, and (5) periodically reducing the pressure differential to allow the vibration to dislodge any jammed articles. The frequency and amplitude of the vibration and the duty cycle and period of the pressure differential are adjusted to dislodge jammed articles during the time the pressure differential is reduced, while retaining in the holes the elongate articles which have been inserted into the holes in a proper orientation. The bonding method comprises the steps of (1) inserting the elongate articles into holes in a carrier, (2) removing any excess articles, (3) masking the carrier to prevent bonding material adhering to the carrier, applying bonding material to the ends of the elongate articles in accordance with the mask, (5) bringing the ends of the elongate articles into contact with the contact points on the substantially flat surface to which the articles are to be bonded, (6) applying pressure to each elongate article individually, (7) heating the contact points on the substrate surface and the elongate articles to form a permanent bond between them and (8) cooling the elongate atticles and contact points to allow the bonding material to set.

6 Claims, 16 Drawing Figures

INVENTORS
WALTER VON KAENEL
JOHN M. LAW
ALFRED STRICKER

BY Maurice H. Klitzman
ATTORNEY

AUTOMATIC PIN INSERTION AND BONDING TO A METALLIZED PAD ON A SUBSTRATE SURFACE

BACKGROUND OF THE INVENTION

The invention relates to the field of bonding articles to a surface substantially perpendicular to the lengths of the elongate articles, and relates more particularly to the field of bonding headed pins to substrates in the field of semiconductor integrated circuits.

2. Background of the Invention

The integrated circuit semiconductor industry has found it desirable to attach metal pins to substrates for the purpose of forming electrical and mechanical connections between substrates and external circuits, including direct connections to other substrates. It has been known in the art (1) to insert pins to be bonded to a substrate into a carrier, (2) to place a disk of bonding material on top of the head of each pin, (3) to place the substrate on top of the carrier and then (4) to bake the carrier, pins and substrate to cause the bonding material to soften and form a permanent bond between the pins and the substrate upon cooling. This method of bonding the pins presents several problems. First, ununevenness in the surface of the substrate and variations in the thickness of the heads of the pins cause the distance between the pin heads and the substrate to vary. Larger than intended distances between the pins and the substrate cause weak bonds, since there is insufficient bonding material between the pins and the substrate. In extreme cases, complete failure to bond a pin can occur. Secondly, the area of the bond between the pin and the substrate varies because during the bonding process some of the bonding disks shift positions slightly in response to handling and surface variations of the substrate. The shift of a bonding material disk results in only part of a pin head being bonded to the substrate. This partial bonding is undesirable, since it increases the electrical resistance of the contact, as well as weakening the bond mechanically.

An aditional problem with the prior art bonding systems is that the pins are normally inserted in the carrier in one location and subsequently transported to another location for the application of the bonding material. This can result in mechanical damage to the pins, accidental expulsion of a pin from a hole or in contamination of the pins, as by oxidation or the deposition of an oily film. This contamination or damage can result in bonds whose mechanical strength or electrical conductivity is impaired or Impaired bonds present reliability problems, since they not always are discovered during testing. The accidental explusion of a pin from a hole results in a missing pin and the substrate must either be reworked to add the pin or discarded.

The prior art has provided several mechanized ways of inserting pins into a carrier as the first step of the bonding process. First, if the pins are of a magnetic material, they may be inserted into the carrier by placing them on the carrier and applying a magnetic field parallel to the axes of the pin holes in the carrier. The magnetic field stands the pins on end. With the pins standing on end the carrier is moved back and forth under them until a pin has fallen into each pin hole in the carrier. This method has the disadvantage that the pins must be of a magnetic material and is restricted to use with straight pins which are symmetrical end to end, since the magnetic field cannot selectively orient asymmetric pins in a preferred orientation.

A second prior art method of inserting pins into a carrier is to place the carrier on a vibrator table and dispense pins onto the surface of the carrier. The vibration of the table causes the pins to bounce on the surface of the carrier, and occasionally a pin will fall into a hole. This is an unsatisfactory method because of the long time required to fill each pin hole. In an attempt to reduce the time necessary to fill all the holes, a steady vacuum has been applied to the bottom of the pin holes. This sucks pins into the pin holes, thus increasing the rate at which the holes are filled. This has been somewhat successful in reducing the time necessary. to fill the holes, since the pins bounced with a proper orientation adjacent to a pin hole are sucked into the pin hole. However, the application of steady vacuum to the bottom of the pin holes causes pins to jam over the pin holes. Pins jam when they are orientated so that they cannot enter a hole, but are held against the hole by the vacuum. Jammed pins must be manually cleared, thus requiring constant supervision of the pin inserting mechanism.

Neither of the above systems had had notable success in inserting asymmetric pins. The magnetic system cannot selectively orient the pins and in the vacuum system many pin jams result from pins arriving at pin holes in undesired orientations.

OBJECTS OF THE INVENTION

With the above prior art problems in mind, a primary object of the present invention is to bond a plurality of elongate aritcles to a plurality of contact points on a electrical conductivity and mechanical strength.

Another object of the invention is to bond elongate articles to contact points on a substantially flat surface in a manner which prevents damage to the articles, once they are inserted in a carrier.

Another object of the invention is to apply bonding material to articles in such a way that uniform bonds between the articles and a substrate result.

Still another object of the invention is to automatically dislodge articles which become jammed during the insertion of elongate articles into a carrier.

A further object of the invention is to automatically insert asymmetric elongate articles into a carrier without requiring a large excess of articles and without having to interrupt the insertion process to free jammed articles.

A still further object of the invention is to automatically remove asymmetric elongate articles which are inserted into holes in a nondesired orientation.

SUMMARY OF THE INVENTION

The invention bonds elongate articles such as pins to contact points on a substantially flat surface such as a substrate by automatically (1) inserting the elongate articles into a carrier, (2) removing any excess articles, (3) masking the carrier, (4) applying bonding material to the ends of the elongate articles in accordance with the masking, (5) placing the substrate on the carrier with corresponding contact points directly above the ends of the elongate articles, (6) applying pressure to each elongate article individually to insure a firm bond of uniform thickness between each article and the corresponding contact point, (7) heating the elongate articles and the contact points for a sufficient time and to a sufficient temperature to assure the formation of a permanent bond between each article and the corresponding contact point, and (8) cooling the articles and the contact points until the bonding material has set.

At the beginning of the bonding process, a plurality of elongate articles are inserted into a plurality of holes in a carrier by (1) placing the articles on the carrier, (2) vibrating the carrier, (3) applying a pressure differential between the tops and the bottoms of the holes, and (4) periodically reducing the pressure differential. The pressure differential causes air to flow into the tops of the holes during the periods of high pressure differential. The air flows into the tops of the holes, assists the elongate articles in entering the holes by creating a suction force which attracts the articles into the holes. The periods of reduced pressure differential provide automatic dislodging of jammed articles by reducing the air flow into the tops of the holes so that the vibration of the carrier can overcome the suction force on the articles and dislodge the article jams.

The article insertion is performed by a mechanism comprising a carrier support for supporting the carrier, a vibrator for vibrating the carrier support and a pulsating-pressure-differential means connected to provide a pulsating pressure-differential between the tops and the bottoms of the holes in the carrier.

The foregoing and other objects, features and advantages of the invention will be apparent from the following more particular description of a preferred embodiment of the invention as illustrated in the accompanying drawings.

BRIEF DESCRITPION OF THE DRAWINGS

FIG. 1 illustrates the insertion of articles into a carrier.

FIG. 2 illustrates the removal of excess articles from the carrier.

FIG. 3 illustrates the placement of a mask over the carrier.

FIG. 4 illustrates deposition of bonding material through the mask.

FIG. 5 illustrates the removal of the mask.

FIG. 6 illustrates the placement of a substrate on the carrier and the inversion of the unit.

FIG. 7 illustrates the placement of an article weight on top of the carrier and the subsequent baking of the unit.

FIG. 8 illustrates the finished substrate having the articles bonded to it.

FIG. 10 shows some articles being inserted into the carrier.

FIG. 11 shows some article jams.

FIG. 12 shows the position of the articles as the pressure differential is being reduced.

FIG. 13 shows aricle jams being dislodged by vibration during a period of reduced pressure differential.

FIG. 14 shows the dislodged article being attracted to holes in the carrier as the pressure differential increases.

FIG. 15 shows the reduced number of articles jams resulting after the reattraction of the dislodged articles to the carrier.

FIG. 16 shows the carrier subsequent to the last article being properly inserted.

DESCRIPTION OF THE PREFERRED EMBODIMENT

Figure 7:
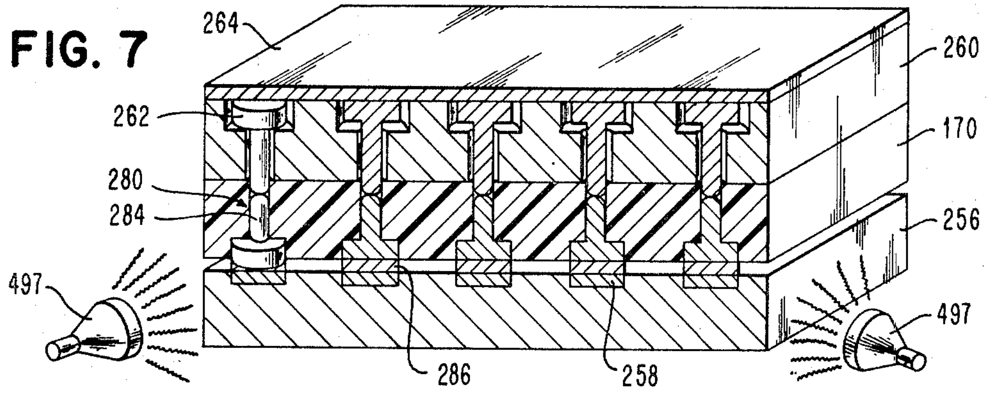
Figure 8:
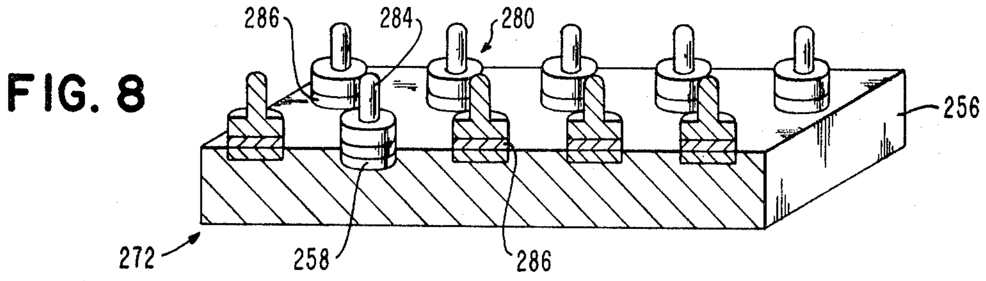
Figure 9:
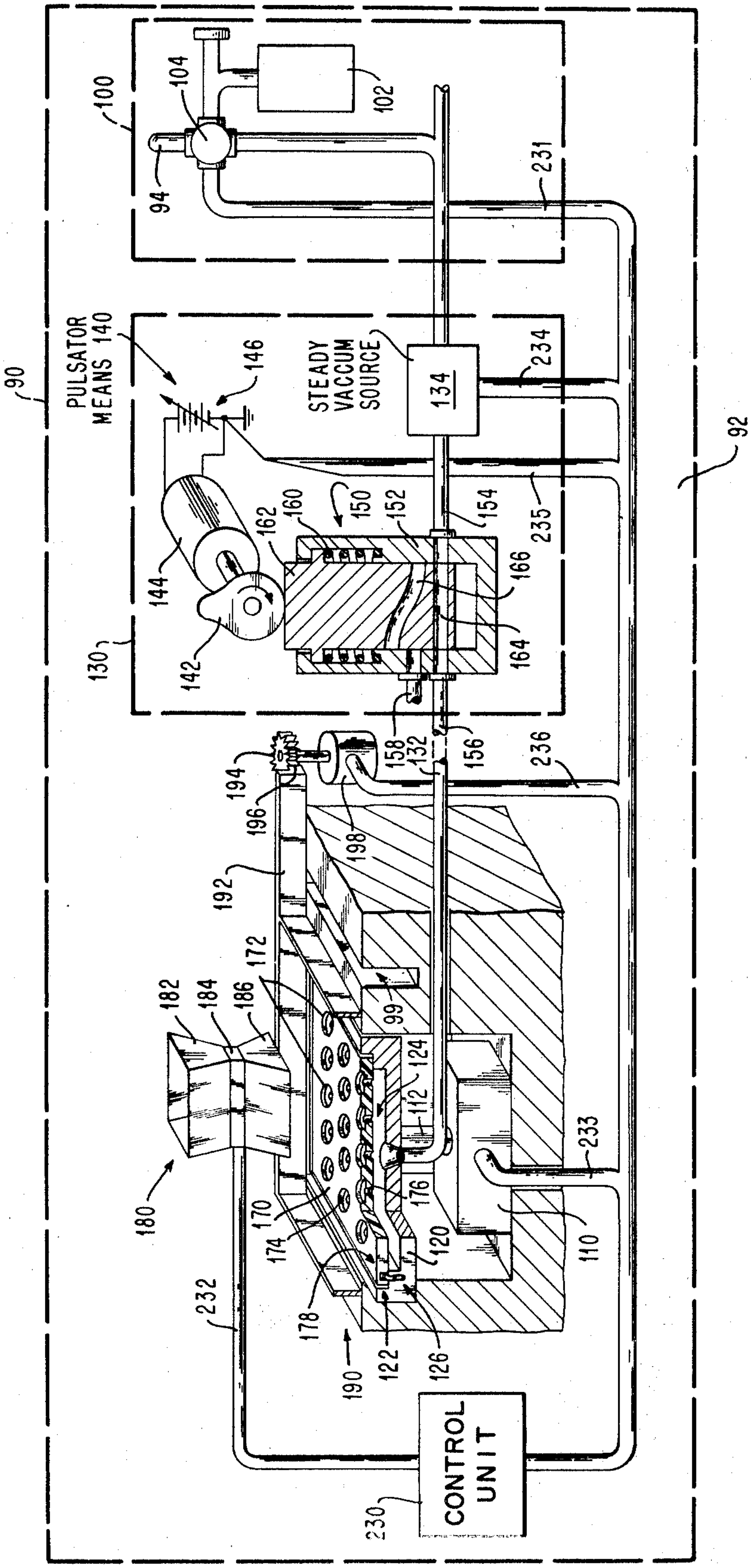
FIG. 9 is a diagram in partial section showing apparatus for carrying out the article insertion method.

The method steps of the invention, which are shown in FIGS. 1–8, will be discussed in connection with the operation of the invention following a discussion of the apparatus shown in FIG. 9.

An insertion housing 90 has a gas tight chamber 92 so that the system can be used with elongate articles 280 which would be contaminated or damaged by the ambient atmosphere. When a non-contaminating atmosphere is desired, an inlet port 94 is connected to a purge-gas supply 100.

The purge-gas supply 100 is comprised of a purge gas source 102 which provides the non-contaminating gas and a gas flow regulator 104 which controls the flow of the purge gas in response to a control signal from control means 230 on cable 231. The purge gas entering the chamber 92 through port 94 drives the ambient atmosphere out through exhaust port 158 which is connected to the atmosphere.

A vibrator means 110 is located within the insertion housing 90 where it supports a carrier support 120. The vibrator means 110 may be any vibrator having a vibration frequency and amplitude appropriate to elongate articles 280 which are to be inserted into a carrier 170. The energization of vibrator 110 is controlled by control means 230 through cable 233. The vibration frequency and amplitude necessary to minimize the time required to fill all of the holes in the carrier depend on the articles 280 to be inserted and on the characteristics of carrier 170 into which the articles are to be inserted. The vibraion amplitude is preferably equal to the length of elongate articles 280. For a given article 280 and carrier 170, the vibration frequency which will minimize the time required to fill all the holes in carrier 170 is best determined experimentally. The frequency of the vibration is preferably made adjustable. A requency in the neighborhood of 120 hz is preferred for small articles on the order of 65 mils in length which are to be inserted into a carrier an inch and a half square.

A carrier support means 120 contains a cavity 122 for supporting carrier 170. When a carrier is in cavity 122, vacuum manifold 124 at the bottom of the cavity communicates with the bottoms of a plurality holes 172 in carrier 170. The cavity includes an alignment means 126 which is shown as an alignment pin. Alignment means 126 assures that carrier 170 will be accurately aligned with carrier support 120. Vibrator shaft 112 provides the vertical support for carrier support 120. Thus, vertical motion impressed on vibrator 112 by the vibrator means 110 is imparted to carrier support means 120.

The pulsating pressure differential means 130 provides a pulsating pressure differential between the tops and the bottoms of holes 172 in carrier 170 to assist elongate articles 280 in entering holes 172 during periods of high pressure differential by causing air to flow into the tops of holes 172 while periods of reduced pressure differential provide automatic dislodging of article jams by reducing air flow into the tops of the holes so the vibration of the carrier will dislodge the article jams. The pressure differential means 130 is shown as a pulsating vacuum source. The source is connected by vacuum hose 132 to vacuum manifold 124 in carrier support 120. The pulsating vacuum source may be comprised of a steady vacuum source 134 and a pulsator means 140 for converting the steady vacuum of source 134 to a pulsating pressure differential between the tops and bottoms of the holes.

Steady vacuum source 134 may be any recognized source of a steady vacuum, such as a vacuum pump. Pulsator means 140 converts the steady vacuum to a pulsating vacuum in a controlled manner. Pulsator means 140 is illustrated as a valve 150 which is powered by a variable DC voltage source 146. Control means 130 controls variable voltage source 146 through cable 235 and thus determines the period of the vacuum cycle by controlling the speed of motor 144. The shape of cam 142 controls the duty cycle of pulsating vacuum source 134. For the specific article and carrier described above, a duty cycle of about 95 percent vacuum is preferred with a period of about one second.

Valve 150 comprises a valve housing 152 having an inlet port 154, an outlet port 156, and an exhaust port 158, a valve spring 160 and a valve plunger 162 having therein a primary channel 164 and a secondary valve channel 166. Primary valve channel 164 connects inlet port 154 to outlet port 156 when valve plunger 162 is in its normal upward position, to which it is biased by spring 160. Secondary valve channel 166 connects inlet port 154 to exhaust port 158 when valve plunger 162 is in its downward position.

Figure 1:
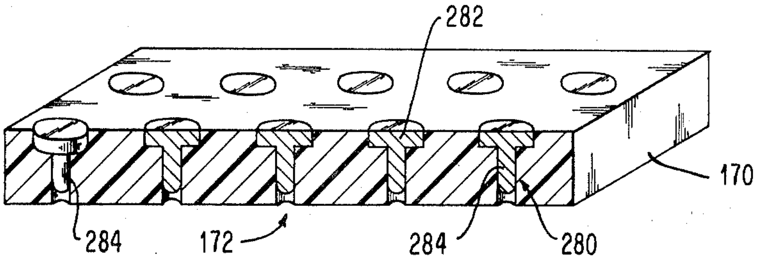
FIGS. 1 through 8 illustrate the steps in the method of bonding elongate articles to contact points on a substantially flat surface.

Carrier 170 contains a plurality of holes 172 for receiving the elongate articles which are illustrated in FIG. 1 as pins 280 having a head 282 and a shaft 284. Pin head 282 porvides a relatively large area to bond to a substrate. Holes 172 in carrier 170 shown in FIG. 9, are adpated to receive pins like pin 280. In the event that an article of a different shape were used, holes 172 would be changed accordingly. Pin holes 172 have an enlarged section called a head seat 174 at the top, into which head 282 of pin 280 fits loosely. Head seat 174 is designed so that when an article 280 is inserted in hole 172, a substantially air tight seal will be formed by the bottom of pin head 282 resting on the bottom of head seat 174. The lower part of the pin hole 172 is comprised of a shaft way 176 fits with shaft 284 of pins 280. The carrier also has an alignment means 178 for mating with alignment means 126 of carrier support means 120. Alignment means 178 is shown as a hole to match the pin shown as the alignment means 126. The two alignment means 126 and 178 serve to accurately align carrier 170 with carrier support means 120. Accurate alignment is desired so that there will be proper alignment of the mask 202 with the holes during the masking step.

An article supply means 180 is provided to automatically introduce elongate articles 280 onto carrier 170. Article supply means 180 comprises of an article hopper 182 for storing elongate articles 280 and an article gate 184. Gate 184 is controlled by control means 230 through cable 232 to release articles onto the upper surface of carrier 170.

An excess article remover means 190 removes excess articles at the end of the article insertion step in response to a control signal on cable 236 from control means 230 to allow the masking step to begin. Excess article remover 190 is comprised of an excess article removing frame 192 which is moved by gear 194 engaging a rack 196 on one of the members of frame 192. Gear 194 is driven by a motor 198. Excess articles are swept into an excess article chute 99 in insertion housing 90.

Control means 230 controls the sequence and timing of the operations involved in performing the bonding operation. The control means 230 may be any of a variety of control mechanisms, including a computer and will not be further described herein, since one skilled in the art will readily understand how to build or adapt a control means for use with this invention. Control means 230 exercises control over the operations of the mechanism through the control cables.

FIGS. 10 to 16 show various stages in the insertion of articles into the holes in the carrier 170. FIGS. 10 - 16 will be discussed in detail in the discussion of the operation of the preferred embodiment, which follows.

OPERATION OF A PREFERRED EMBODIMENT

Briefly, the invention's method of bonding articles to substrate is performed in the following way. First, as is shown in FIG. 1, articles 280 are inserted into holes 172 in carrier 170 to establish the spacing among the elongate articles which is desired subsequent to their being bonded to contact points on a substantially flat surface.

Figure 2:
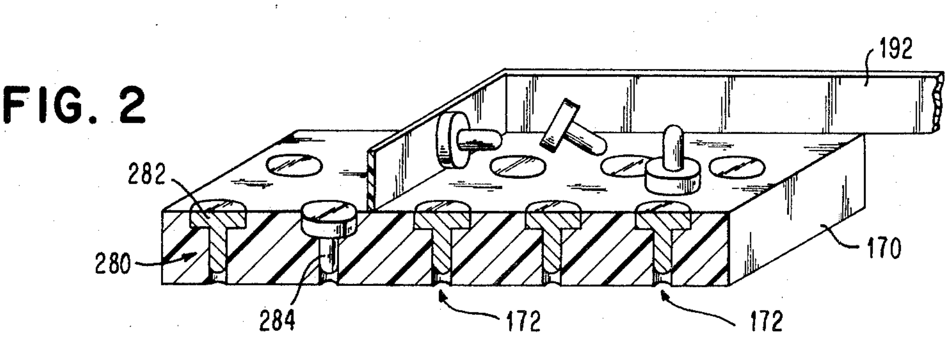

After all the holes are filled, any excess articles are removed by excess article removing frame 192 as in FIG. 2.

Figure 3:
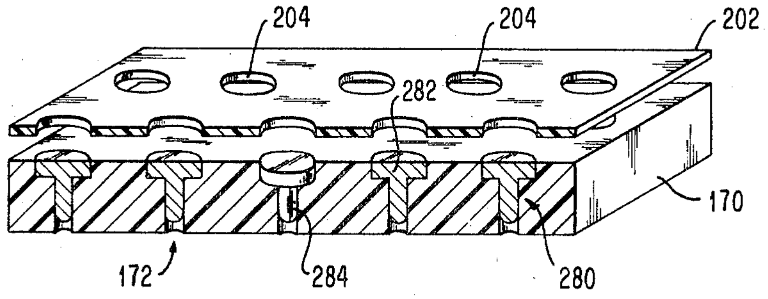

Then, as shown in FIG. 3, the carrier is masked by placing a mask 202 on top of carrier 170 with apertures 204 in mask 202 in alignment with holes 172 in carrier 170. Since the holes are filled with articles 280, the apertures 204 in mask 202 are aligned with articles 280.

Figure 4:
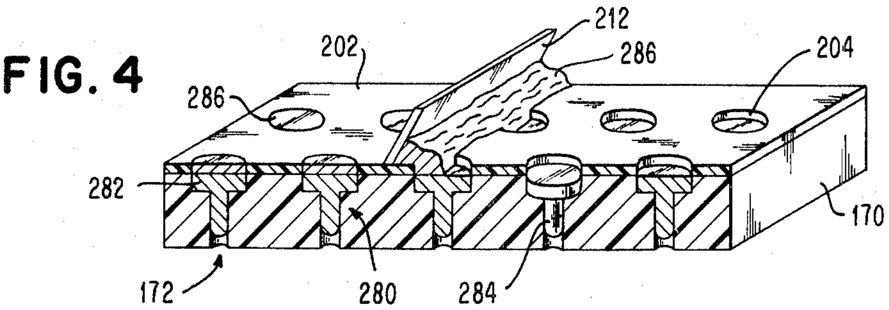

Next, the bonding material is applied to enlarged ends 282 of articles 280 by placing a quantity of bonding material 228 on top of mask 202, spreading bonding material 228 and wiping off any excess material with a bonding material spreader 212, as shown in FIG. 4. Bonding material spreader 212 forces bonding material 228 into each aperture 204 in mask 202 and onto ends 282 of the article below that aperture.

Figure 5:
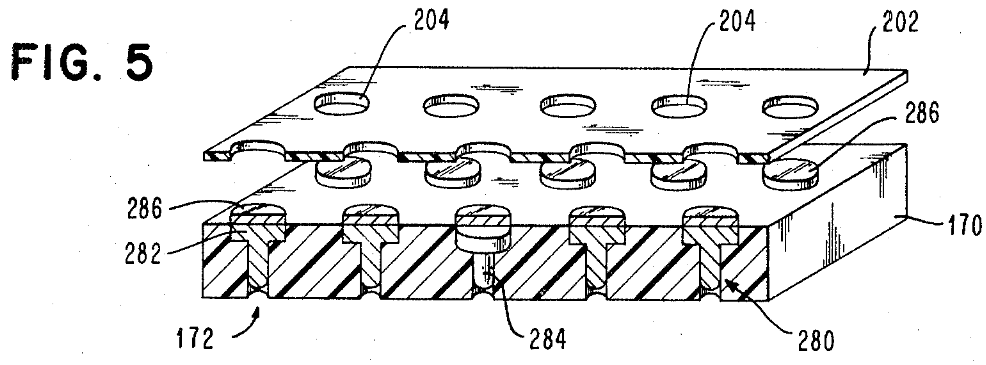

After the spreader has filled each mask aperture 204, mask 202 is removed leaving a deposit 286 of bonding material on top of each article 280 as shown in FIG. 5.

Figure 6:
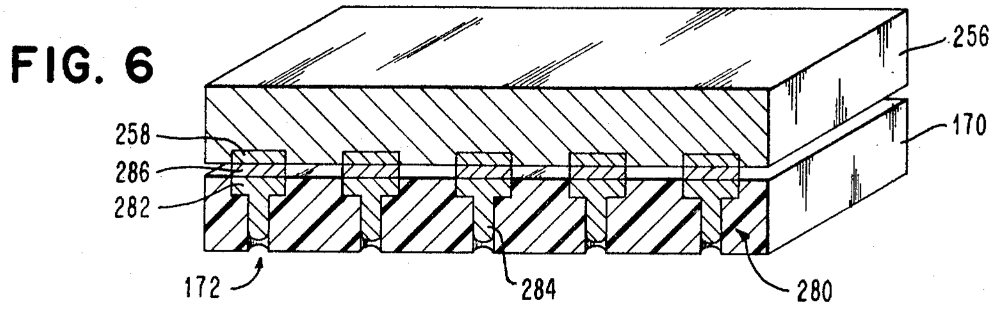

Then substrate 256 to which articles 280 are to be bonded in placed on top of carrier 170 with its contact points 258 in alignment with articles 280. Carrier 170, substrate 256 and article 280 are then inverted as a unit as shown in FIG. 6.

An article weight fixture 260 having individual article weights 262 is then placed over carrier 170 with individual article weights 262 in alignment with the holes in carrier 170. Each article weight 262 presses on a single article 280 as shown in FIG. 7. The article weight 262 supplies sufficient pressure to assure a good bond between article 280 and substrate contact point 258.

Contact points 258 and articles 280 are heated for a suffficient time and to a sufficient temperature to assure the formation of a permanent bond between each article 280 and substrate contact points 258. The heating is preferably performed in an oven heated by a heating means 497.

To finish the bonding method, articles 280 and contact points 258 are cooled to allow bonding material 286 to set. Once bonding material 286 has set, article weight fixture 260 and carrier 170 may be removed exposing a finished substrate 272 with articles 274 permanently attached thereto by set bonding material 286 as shown in FIG. 8.

Figure 10:
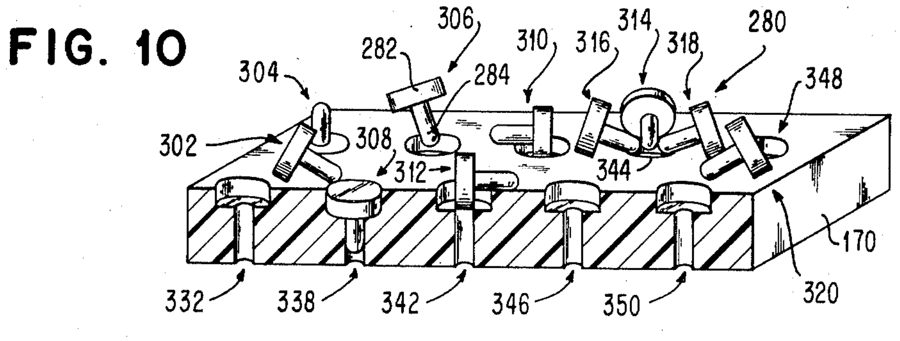
FIGS. 10 through 16 shows various stages in the method of inserting elongate articles into a carrier.
Figure 11:
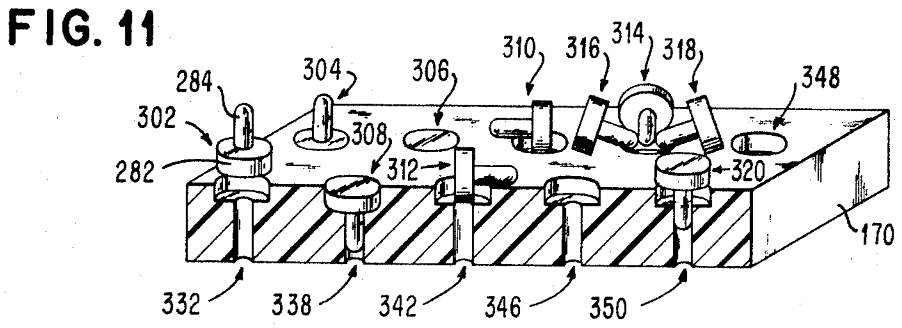
Figure 12:
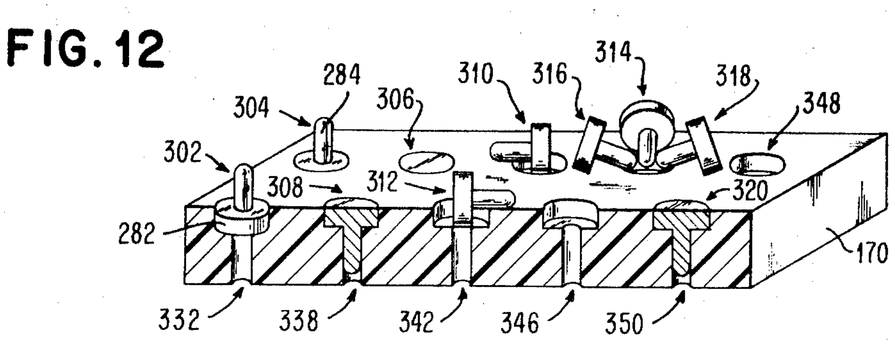

The performance of the bonding method having been briefly described above, the detailed operation of the pin insertion apparatus will now be described. The bonding operation begins by activating purge gas supply 100, if a purge gas is to be used. The operation procedes by opening hopper gate 184 to release a quantity of pins into pin shute 186 which guides pins 280 onto carrier 170. Vibrator 110, vacuum source 134 and valve motor 144 are all energized. Vibrator 110 vibrates carrier support 120 and carrier 170, while pulsating pressure differential soruce 130 (valve 150 and vacuum souce 134) induces a pulsating pressure differential between the tops and bottoms of articles holes 172 in carrier 170. In the preferred embodiment, the pressure differential source is a pulsating vacuum source which supplies a pulsating vacuum to the bottoms of holes 172. As shown in FIG. 10, the vibration agitates article 280 on the surface of the carrier 170 while the articles are attracted toward holes 172 by air being sucked into the holes by the pressure differential. Agitation of the articles assists the air flow in attracting the articles into the holes by raising the articles free of the surface of carrier 170. An article such as 306 which arrives at a hole 172 with its shaft 284 toward the hole will be drawn into the hole by a combination of the vacuum suction and the vibration. The suction tends to pull the point of the pin into hole 172 while the vibration raises head 282 of pin 306 from the surface of carrier 170, thus bringing the pin into a proper orientation to be drawn into the hole by vacuum. An article which arrives at a hole headfirst will jam, either with the side of the head down in the hole (articles 310 and 312 in FIG. 10) or with the pin in the hole upsidedown (article 304 in FIG. 10). The suction in a hole 172 is sufficient to hold these misoriented pins in these positions as illustrated by pins 304, 310 and 312. If several pins such as 314, 316 and 318 arrive at a hole (344) substantially simultaneously, an article jam may result from each pin being prevented from entering the hole by the other pins. The vacuum holds these pins in a jammed position while articles 302 and 320 which have not yet arrived at a hole continue to be agitated by the vibration and drawn toward open holes by suction. As shown in FIG. 10, articles 302 and 320 are attracted to holes 332 and 350. In FIG. 12, pin 302 is shown entering hole 332 upsidedown and pin 320 is shown entering hole 350 in the proper orientation.

After many cycles of vibration the vacuum reduces as cam 142 forces valve plunger 162 downward to disconnect valve outlet port 156 from valve inlet port 154. This is shown at 53 in line F of FIG. 22. Its connecting outlet port 156 from inlet 154 connects exhaust 158 to inlet port 154 and connects the vacuum source 134 to the outside air. Thus, the flow of air into the vacuum source continues, preventing a vacuum surge when the vacuum is later turned back on.

Figure 13:
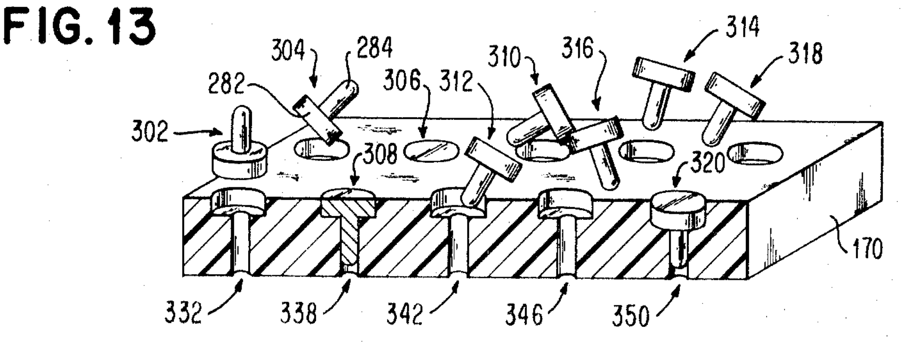
Figure 14:
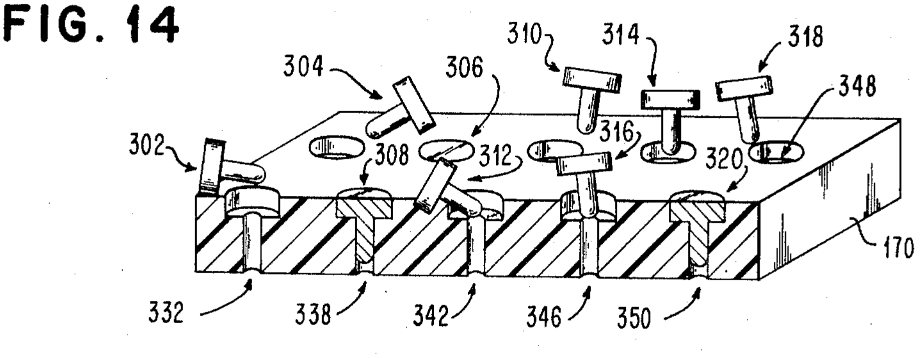
Figure 15:
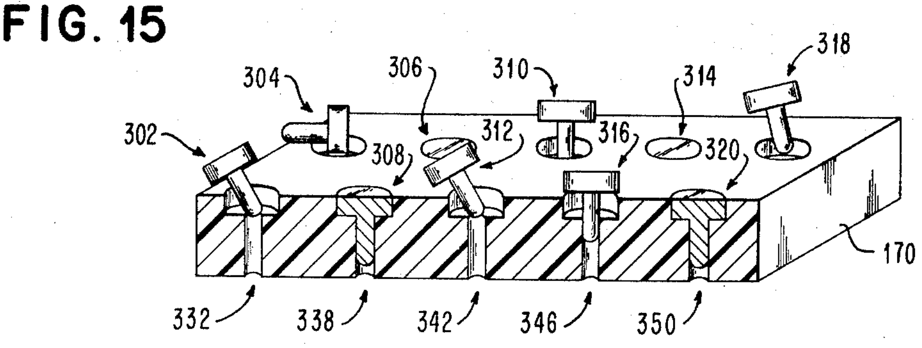
Figure 16:
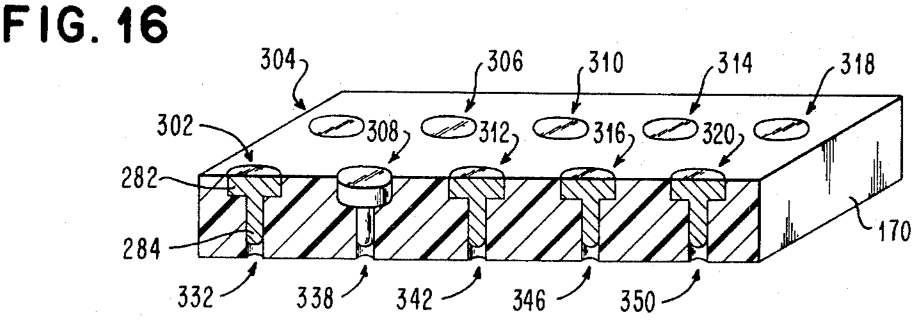

As is shown in FIG. 13, once the vacuum is shut off the jammed articles 302, 304, 310, 312, 314, 316 and 318 are bounced free of the holes by the vibration. Only a short period without the vacuum is necessary to free the article jams. Articles such as 306, 308 and 320 which are properly inserted are not bounced free by the vibration because side friction on the pin shaft 284 in shaftway 176 of pin holes 170 is sufficient to holes the pin despite the vibration. When the vacuum increases as cam 142 allows valve plunger 162 to return to its normal position, loose articles are again attracted toward holes 172 by suction as shown in FIG. 14. Some of the articles 302, 310, 312, 314, 316 and 318 will arrive at empty holes with the proper orientation for insertion and will be inserted into the holes. Some pins may arrive with an orientation which causes them to jam again as is illustrated by pin 304 in FIG. 15. These newly jammed articles will be released on the subsequent vacuum reduction and will be reattracted when the vacuum next increases. This process repeats until all the holes have been filled by properly oriented articles as in FIG. 16. The length of the hole filling cycle is sufficient to assure complete filling of the carrier holes. If minimum time is desired, the filling of all the holes can be sensed from the amount of air flow through hose 132 and the hole filling cycle can be stopped when the last hole is filled.

Once all the holes are filled with articles, vibrator 110, vacuum source 134 and motor 144 are deenergized. The vibrator 110 is biased so that it will stop with the surface of carrier 170 flush with the surrounding surface of the insertion housing 90. With carrier 170 flush with the surrounding surface, excess article removing means 190 is activated to push any excess articles into chute 99 as frame 192 moves toward the right in FIG. 9. The article removing frame 192 is retained in its right-most position, where is does not obstruct the lowering of mask 202.

The rest of the bonding method is then carried out by any suitable apparatus. The final step in the bond process is the cooling of the articles. Subsequent to the cooling operation, article weight unit 260 and carrier 170 are removed, exposing the finished substrate, as shown in FIG. 8.

The process of the invention thus prevents damage to the articles 280, once they have been inserted in the carrier 170 because there is no subsequent handling of the carrier prior to the deposition of the bonding material and minimum handling prior to the bonding of the articles to the substrate. Formation of uniform bonds between articles 280 and substrate 256 is assured, since the same amount of bonding material is deposited on each article through mask 202 and each article is pressed against the substrate with the same force during baking by article weight fixture 260.

During the process of inserting the article into carrier 170, article jams are automatically dislodged by the vibration during the period of reduced pressure differential as are misoriented articles. The automatic dislodging of article jams combined with the suction attraction of articles to empty holes provides 100 percent filling of the holes in a carrier 170 without excess articles being present since loose articles tend to migrate toward unfilled holes.

Applying bonding material 228 in a noncontaminating atmosphere as in the present invention helps to reduce the possibility of finished bond failures, thus improving quality control. The form of the pins 280 is exemplary of an article with which the invention can be used and is not to limit the form of the elongate articles with which the invention can be used.

The excess article remover 190 and associated apparatus such as frame 192 can be omitted entirely by affixing enclosed tray-like surfaces so as to open onto the upper surface of carrier 170. By using two such trays on either side of carrier 170 and placing loose pins in one of those trays, carrier 170 can be loaded by rocking this tray/carrier arrangement back and forth while the vibration and pulsating vacuum are present as mentioned before. The pins slide from one tray to the other across the upper surface of carrier 170 filling the holes thereof and the excess pins can be trapped in one tray after carrier 170 is loaded simply by tilting.

While the invention has been particularly shown and described with reference to a preferred embodiment thereof, it will be understood by those skilled in the art, that various changes in form and detail may be made therein without departing from the spirit and scope of the invention.

What is claimed is:

1. The method of inserting a plurality of elongate articles into a plurality of holes in a carrier comprising the steps of:

introducing the elongate articles onto the carrier;

vibrating the carrier to agitate the elongate articles to encourage them to enter the holes in the carrier;

inducing a pressure differential between the tops and bottoms of the holes to assist the elongate articles in entering the holes by causing a gas to enter the tops of the holes and draw the articles into the holes, and;

periodically reducing the pressure differential to dislodge jammed articles by reducing the flow of fluid into the tops of the holes so that the vibration of the carrier will dislodge the jammed articles.

2. The method of claim 1 wherein the pressure differential is produced by applying a pulsating vacuum to the bottoms of the holes.

3. A method of automatically inserting a plurality of elongate articles into a plurality of holes in a carrier, comprising the steps of:

placing th carrier in a carrier support;

introducing the elongate articles onto the carrier;

vibrating the carrier to agitate the elongate articles to assist the elongate articles in entering the holes;

applying a vacuum to the bottoms of the holes to assist the elongate articles in entering the holes by drawing a gas into the tops of the holes, and;

periodically reducing the vacuum to dislodge any jammed articles by reducing the flow of gas into the tops of the holes so that the vibration of the carrier will dislodge the jammed articles.

4. An apparatus for automatically inserting a plurality of elongate articles into a plurality of holes in a carrier, comprising:

carrier support means for supporting the carrier;

vibrator means for vibrating the carrier support means to vibrate the carrier and agitate any articles thereon;

hopper means adjacent to the carrier support means for storing elongate articles and for introducing elongate articles onto the surface of a carrier in the carrier support means, and;

a pulsating-pressure-differential means for establishing a periodically interrupted higher pressure at the tops of the holes in the carrier than at the bottoms of the holes in the carrier, in order to induce gas flow into the tops of the holes during the periods of high pressure differential to assist the elongate articles in entering the holes, while the periods of reduced pressure differential provide automatic dislodging of article jams by reducing the gas flow into the tops of the holes so that the vibration of the carrier will dislodge any article jams.

5. The apparatus of claim 4 wherein the pressure differential source includes a source of a purge gas for expelling contaminating vapors from vicinity of the articles.

6. The apparatus of claim 4 wherein the pulsating-pressure-differential means is a pulsating vacuum source.

* * * * *

UNITED STATES PATENT OFFICE

CERTIFICATE OF CORRECTION

Patent No. 3,736,651 Dated June 5, 1973

Inventor(s) John M. Law; Alfred A. Strickler; Walter Von Kaenel

It is certified that error appears in the above-identified patent and that said Letters Patent are hereby corrected as shown below:

Column 1, line 5, should read --1. Field of the Invention--.

Column 9, line 41, "th" should read --the--.

Signed and sealed this 5th day of March 1974.

(SEAL)
Attest:

EDWARD M. FLETCHER, JR.
Attesting Officer

C. MARSHALL DANN
Commissioner of Patents

BC9-70-008A